US012701718B2

(12) United States Patent
Han

(10) Patent No.: US 12,701,718 B2
(45) Date of Patent: Aug. 4, 2026

(54) SEMICONDUCTOR DEVICE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 702 days.

(21) Appl. No.: 18/076,946

(22) Filed: Dec. 7, 2022

(65) Prior Publication Data

US 2024/0015989 A1 Jan. 11, 2024

(30) Foreign Application Priority Data

Jul. 7, 2022 (KR) ........................ 10-2022-0083907

(51) Int. Cl.
*H10B 63/00* (2023.01)
*H10N 70/00* (2023.01)
*H10N 70/20* (2023.01)
(52) U.S. Cl.
CPC ............. *H10B 63/80* (2023.02); *H10N 70/25* (2023.02); *H10N 70/8833* (2023.02)
(58) Field of Classification Search
CPC ..... H10N 70/25; H10N 70/8833; H10B 63/84
See application file for complete search history.

(56) References Cited

U.S. PATENT DOCUMENTS

| | | | |
|---|---|---|---|
| 10,923,657 B2 * | 2/2021 | Chan .................... | H10N 70/884 |
| 11,404,639 B2 * | 8/2022 | Karpov ................ | H10N 70/826 |
| 2020/0075851 A1 | 3/2020 | Karpov et al. | |

FOREIGN PATENT DOCUMENTS

| | | |
|---|---|---|
| CN | 108231822 A | 6/2018 |
| KR | 1020090052682 A | 5/2009 |
| KR | 1020130122827 A | 11/2013 |
| KR | 1020200018133 A | 2/2020 |
| KR | 1020210043235 A | 4/2021 |

* cited by examiner

*Primary Examiner* — Mark V Prenty
(74) *Attorney, Agent, or Firm* — WILLIAM PARK AND ASSOCIATES LTD.

(57) ABSTRACT

A semiconductor device includes: a bit line; a first barrier layer disposed on the bit line; a variable resistance layer disposed on the first barrier layer; a second barrier layer disposed on the variable resistance layer; and a word line disposed on the second barrier layer. A dielectric constant of the second barrier layer is greater than a dielectric constant of the first barrier layer.

16 Claims, 7 Drawing Sheets

SEMICONDUCTOR DEVICE

CROSS-REFERENCE TO RELATED APPLICATION

The present application claims priority under 35 U.S.C. § 119(a) to Korean patent application number 10-2022-0083907, filed on Jul. 7, 2022, in the Korean Intellectual Property Office, the entire disclosure of which is incorporated herein by reference.

BACKGROUND

1. Technical Field

The present disclosure generally relates to a semiconductor device, and more particularly, to a semiconductor device including a variable resistance layer.

2. Related Art

Studies on semiconductor devices capable of satisfying requirements of a decrease in design rule and increase in degree of integration have been continuously conducted. In an example, a resistance-change memory device having a structure and an operating mechanism, which are different from a structure and an operating mechanism of a conventional flash memory device, has appeared in nonvolatile memory device fields.

The resistance-change memory device may include a memory cell array having a cross-point structure. A memory cell of the resistance-change memory device may be configured with a pair of electrodes and a variable resistance layer disposed between the pair of electrodes. The resistance-change memory device is a nonvolatile memory device in which a resistance state of the variable resistance layer in the memory cell is changed between a high resistance state and a low resistance state, and it may store data corresponding to the resistance state.

Recently, studies on a technique for ensuring the electrical reliability of the resistance-change memory device have been actively conducted.

SUMMARY

In accordance with an embodiment of the present disclosure, a semiconductor device includes: a bit line; a first barrier layer disposed on the bit line; a variable resistance layer disposed on the first barrier layer; a second barrier layer disposed on the variable resistance layer; and a word line disposed on the second barrier layer. A dielectric constant of the second barrier layer is greater than a dielectric constant of the first barrier layer.

In accordance with another embodiment of the present disclosure, a semiconductor device includes: a bit line extending in a first direction; a word line extending in a second direction perpendicular to the first direction; and a memory cell having a pillar structure, which is disposed in a region in which the bit line and the word line overlap with each other. The memory cell includes a first barrier layer adjacent to the bit line, a second barrier layer adjacent to the word line, and a variable resistance layer between the first barrier layer and the second barrier layer. A dielectric constant of the second barrier layer is greater than a dielectric constant of the first barrier layer.

In accordance with still another embodiment of the present disclosure, a semiconductor device includes: a first bit line extending in a first direction; a first memory cell overlapping with a portion of a top surface of the first bit line; a word line extending in a second direction perpendicular to the first direction on the first memory cell; a second memory cell overlapping with a portion of a top surface of the word line; and a second bit line extending in the first direction on the second memory cell. The first memory cell includes a first variable resistance layer. The second memory cell includes a second variable resistance layer. The first variable resistance layer and the second variable resistance layer include a transition metal oxide.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening dements may also be present. Like reference numerals refer to like elements throughout.

FIG. 1 is a view illustrating a semiconductor device in accordance with an embodiment of the present disclosure.

DETAILED DESCRIPTION

Figure 2:
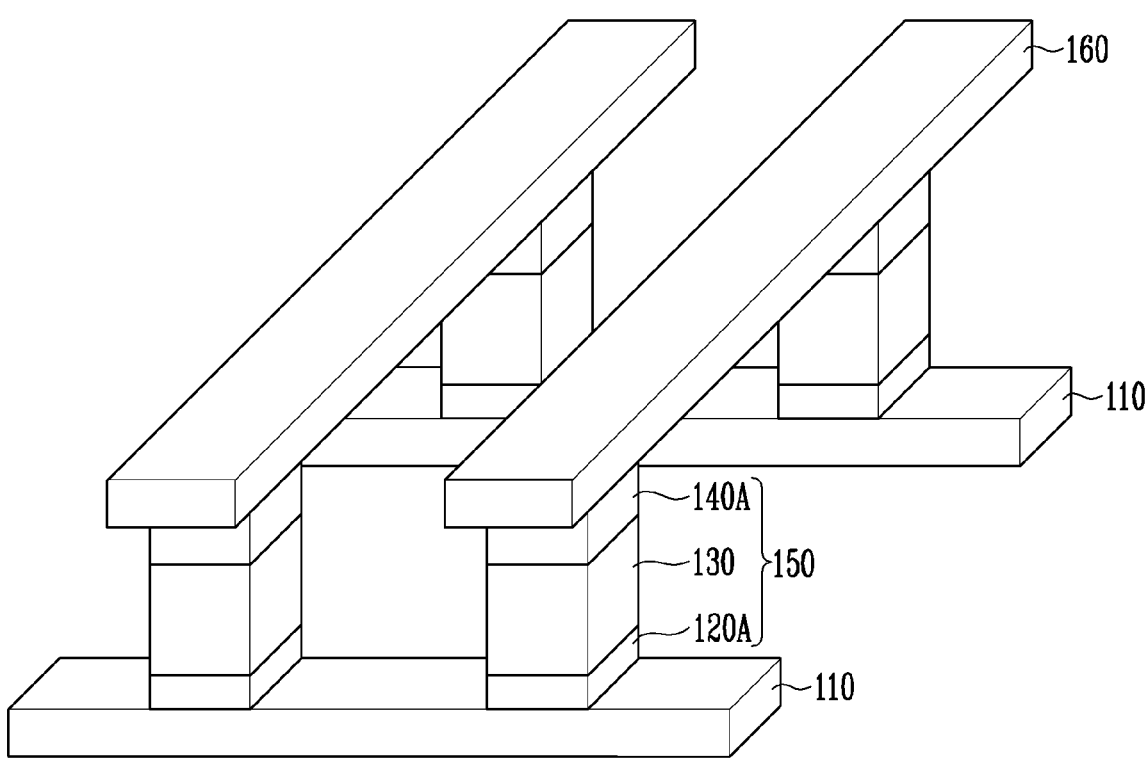
FIG. 2 is a view illustrating a semiconductor device in accordance with an embodiment of the present disclosure.
Figure 2:
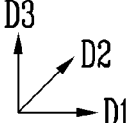

The specific structural and functional descriptions disclosed herein are merely illustrative for the purpose of describing embodiments according to the concept of the present disclosure. Embodiments according to the concept of the present disclosure can be implemented in various forms and should not be construed as being limited to the embodiments set forth herein.

Some embodiments provide a semiconductor device including a variable resistance layer.

It will be understood that, although the terms "first," "second," "third," etc. may be used herein to describe various elements, these elements should not be limited by these terms. These terms are only used to distinguish one element from another element and are not meant to imply a number or order of elements. Thus, a "first" element discussed below could also be termed a "second" element without departing from the teachings of the present disclosure.

Figure 1:
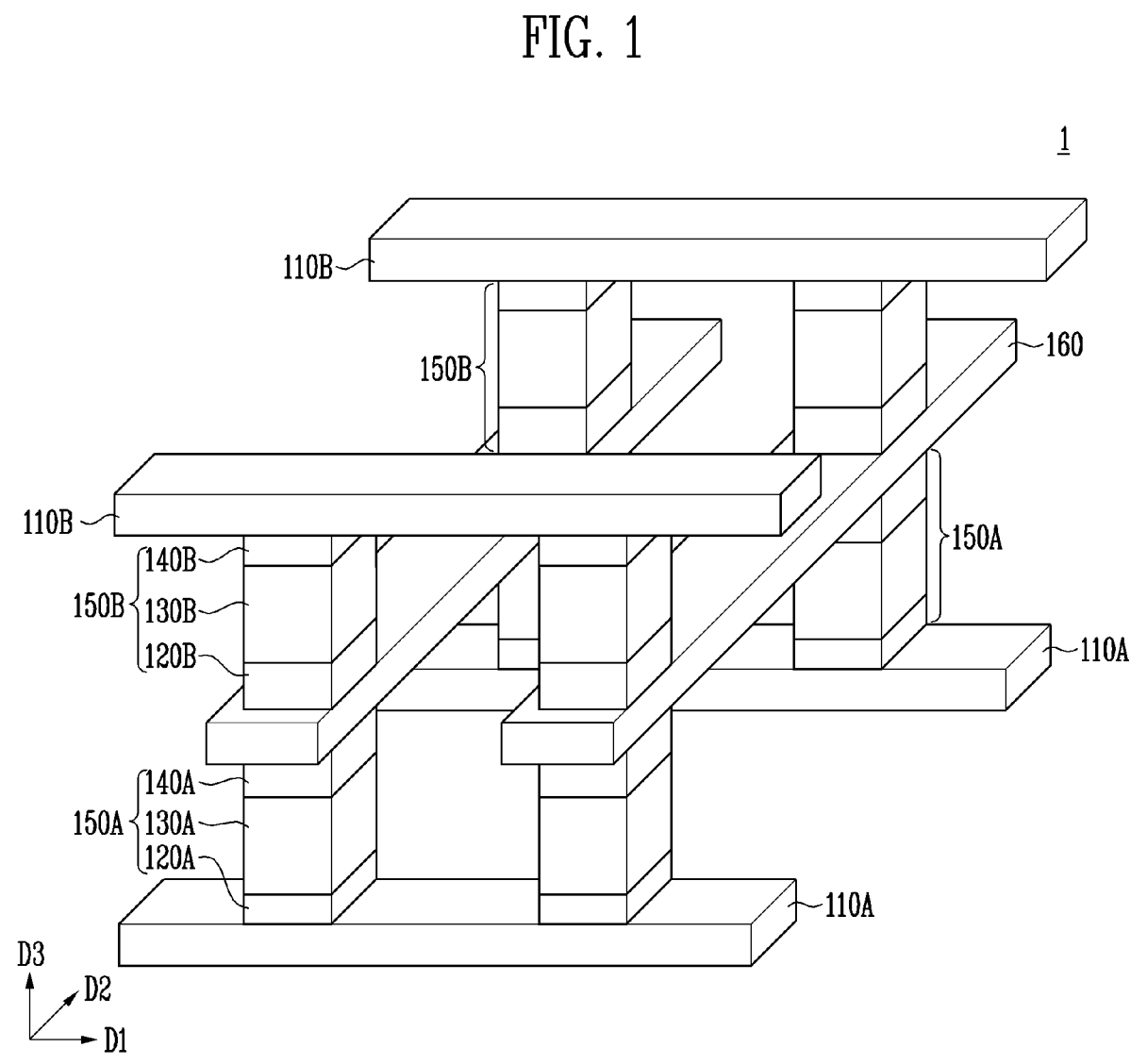

FIG. 1 is a view illustrating a semiconductor device in accordance with an embodiment of the present disclosure.

Referring to FIG. 1, the semiconductor device 1 may be formed in a multi-deck structure. In an embodiment, the semiconductor device 1 may include a first memory cell array of a first deck and a second memory cell array of a second deck. The second memory cell array may be disposed on the first memory cell array.

The first memory cell array may include a plurality of first memory cells 150A connected to a plurality of first bit lines 110A and a plurality of word lines 160, which extend in directions intersecting each other. In an embodiment, the plurality of first bit lines 110A may extend in a first direction D1, and the plurality of word lines 160 may extend in a second direction D2. The plurality of word lines 160 may be spaced apart from the plurality of first bit lines 110A in a third direction D3, Each first memory cell 150A may be disposed between the first bit line 110A and the word line 160.

The second memory cell array may include a plurality of second memory cells 150B connected to the plurality of word lines 160 and a plurality of second bit lines 110B, which extend in directions intersecting each other. In an embodiment, the first memory cell array and the second memory cell array may share the plurality of word lines 160. However, the embodiment of the present disclosure is not limited thereto, and a plurality of word lines for the second memory cell array may be separately provided on the plurality of word lines 160. The plurality of second bit lines 110B may extend in parallel to the plurality of first bit lines 110A. The plurality of second bit lines 110B may be spaced apart from the plurality of word lines 160 in the third direction D3. Each second memory cell 150B may be disposed between the word line 160 and the second bit line 110B.

The plurality of first bit lines 110A and the plurality of second bit lines 110B may include a doped semiconductor, a metal, a conductive metal nitride, a conductive metal carbide, a conductive metal silicide, or a conductive metal oxide. In an example, the plurality of first bit lines 110A and the plurality of second bit lines 110B may include silicon, tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, ruthenium oxide, or any combination of two or more thereof, which is doped with an n-type or p-type dopant.

The first memory cell 150A may include a first barrier layer 120A on the first bit line 110A, a first variable resistance layer 130A on the first barrier layer 120A, and a second barrier layer 140A on the first variable resistance layer 130A. The first barrier layer 120A, the first variable resistance layer 130A, and the second barrier layer 140A may be stacked between the first bit line 110A and the word line 160 in a region in which the first bit line 110A and the word line 160 overlap with each other.

The first barrier layer 120A may perform a function of controlling tunneling of electrons between the first bit line 110A and the first variable resistance layer 130A. The electrons may tunnel through the first barrier layer 120A from the first bit line 110A, thereby being captured in the first variable resistance layer 130A.

The first barrier layer 120A may include a dielectric material. In an example, the first barrier layer 120A may include an oxide, nitride, oxynitride, or any combination of two or more thereof. In a specific example, the first barrier layer 120A may include silicon oxide, silicon nitride, silicon oxynitride, aluminum oxide, or the like.

The first variable resistance layer 130A may include a metal oxide having incomplete bonding between a metal and oxygen. The first variable resistance layer 130A may have a defect occurring in the incomplete bonding. In an embodiment, the first variable resistance layer 130A may include a metal oxide which does not satisfy a stoichiometric ratio. The metal oxide may be a transition metal oxide. In an embodiment, the metal oxide may include hafnium oxide, zirconium oxide, tantalum oxide, titanium oxide, tungsten oxide, or any combination of two or more thereof.

The second barrier layer 140A may prevent electrons distributed inside the first variable resistance layer 130A from being conducted to the word line 160. The second barrier layer 140A may be formed of a material having a dielectric constant greater than a dielectric constant of the first barrier layer 120A.

In an embodiment, the second barrier layer 140A may include ferroelectrics. The flow of electrons in the word line 160 from the first variable resistance layer 130A through the second barrier layer 140A can be suppressed by using a polarization phenomenon of ferroelectrics. Accordingly, in the embodiment of the present disclosure, a data retention characteristic of the first variable resistance layer 130A can be improved. In addition, a high current in low resistance state reading can be secured by using the polarization phenomenon of ferroelectrics. Accordingly, in the embodiment of the present disclosure, a difference in current amount between a read operation of a low resistance state and a read operation of a high resistance state can be increased, and thus a read window can be increased.

A thickness of the second barrier layer 140A may be thicker than a thickness of the first barrier layer 120A. Accordingly, the tunneling efficiency of electrons through the first barrier layer 120A in application of an operating voltage can be improved, and leakage of current through the second barrier layer 140A can be reduced.

The first barrier layer 120A, the first variable resistance layer 130A, and the second barrier layer 140A may form a pillar structure. In an embodiment, the pillar structure may have the form of a cylinder, an elliptical pillar, or a polygonal pillar.

The word line 160 may be spaced apart from the first variable resistance layer 130A by the second barrier layer 140A. The word line 160 may extend in the second direction D2. The word line 160 may include a conductive material. In an embodiment, the conductive material may include a doped semiconductor, a metal, a conductive metal nitride, a conductive metal carbide, a conductive metal silicide, or a conductive metal oxide.

A first write operation on the first memory cell 150A may be performed by applying a predetermined operating voltage to the first bit line 110A and the word line 160 such that electrons are captured in a trap site inside of the first variable resistance layer 130A. The first memory cell 150A may be programmed to a low resistance state by the first write operation. The electrons may tunnel through the first barrier layer 120A by means of the operating voltage for the first write operation, thereby being captured in the first variable resistance layer 130A. In an embodiment, the first write operation may be performed by applying a relatively high voltage to the word line 160 as compared with the first bit line 110A. When the first write operation is ended, the trap site of the first variable resistance layer 130A may maintain a state in which the electrons are captured in the trap site of the first variable resistance layer 130A. Because the second barrier layer 140A is formed of ferroelectrics, a polarization strength of the second barrier layer 140A is enhanced by the electrons captured in the first variable resistance layer 130A, so that the data retention characteristic of the first variable resistance layer 130A can be improved. A resistance of the first variable resistance layer 130A may be changed according to an amount of electrons captured in the trap site. Accordingly, the amount of electrons captured in the trap site is controlled, so that a multi-level cell having a plurality of low resistance states corresponding to a plurality of resistance values can be implemented.

Because the dielectric constant of the second barrier layer 140A is formed greater than the dielectric constant of the first barrier layer 120A, an electric field applied to the first barrier layer 120A may be higher than an electric field applied to the second barrier layer 140A in application of the operating voltage for the first write operation. Accordingly, during the first write operation, the tunneling efficiency of electrons through the first barrier layer 120A can be improved, and the tunneling of electrons in the second barrier layer 140A can be decreased.

The second memory cell 150B may include a third barrier layer 120B on the word line 160, a second variable resistance layer 130B on the third barrier layer 120B, and a fourth barrier layer 140B on the second variable resistance layer 130B. The third barrier layer 120B, the second variable resistance layer 130B, and the fourth barrier layer 140B may be stacked between the word line 160 and the second bit line 110B in a region in which the word line 160 and the second bit line 110B overlap with each other. The third barrier layer 120B may be configured identically to the second barrier layer 140A. The second variable resistance layer 130B may be configured identically to the first variable resistance layer 130A. The fourth barrier layer 140B may be configured identically to the first barrier layer 120A.

In accordance with the above-described embodiment of the present disclosure, the second barrier layer 140A and the third barrier layer 120B, which are adjacent to the word line 160, are thickly formed of a material having a large dielectric constant as compared with the first barrier layer 120A and the fourth barrier layer 140B, which are respectively adjacent to the first bit line 110A and the second bit line 110B, so that data retention characteristics and leakage current characteristics of the first memory cell 150A and the second memory cell 150B can be improved. In addition, the second barrier layer 140A and the third barrier layer 120B, which are adjacent to the word line 160, are formed of ferroelectrics, so that the data retention characteristics and the leakage current characteristics can be improved by using the polarization phenomenon.

FIG. 2 is a view illustrating a semiconductor device in accordance with an embodiment of the present disclosure.

Referring to FIG. 2, the semiconductor device may include a memory cell array having a single-deck structure. Like the first memory cell array described with reference to FIG. 1, the memory cell array may include a plurality of memory cells 150 connected to a plurality of bit lines 110 and a plurality of word lines 160, which extend in directions intersecting each other. Like the first memory cell 150A, the memory cell 150 may include a first barrier layer 120A, a variable resistance layer 130, and a second barrier layer 140A, which are stacked between the bit line 110 and the word line 160.

Figure 3:
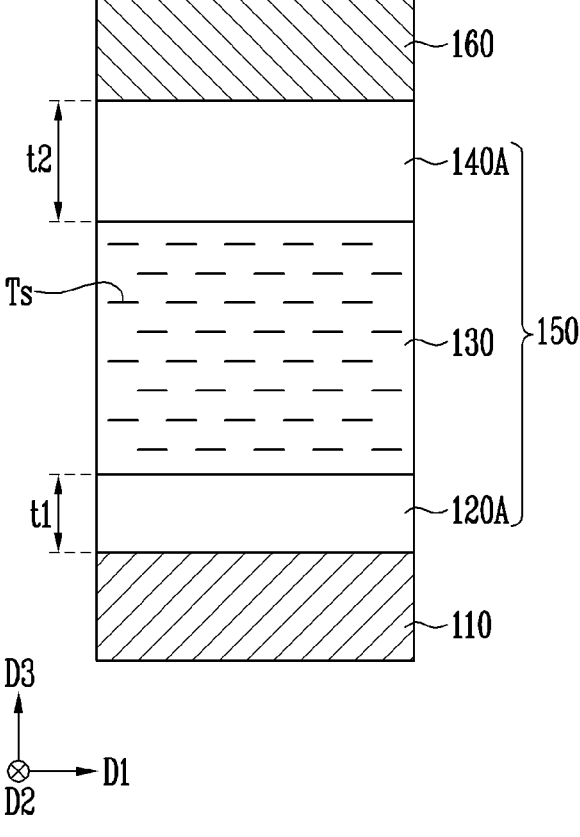
FIG. 3 is a sectional view of a semiconductor device in accordance with an embodiment of the present disclosure.

FIG. 3 is a sectional view of a semiconductor device in accordance with an embodiment of the present disclosure.

Referring to FIG. 3, the semiconductor device may include a memory cell 150 between a bit line 110 and a word line 160. As described with reference to FIGS. 1 and 2, the memory cell 150 may include a first barrier layer 120A disposed on the bit line 110, a variable resistance layer 130 disposed on the first barrier layer 120A, and a second barrier layer 140A disposed on the variable resistance layer 130. Hereinafter, repeated descriptions of components identical to the components shown in FIGS. 1 and 2 will be omitted.

The variable resistance layer 130 may include a metal oxide having incomplete bonding between a metal and oxygen. The variable resistance layer 130 may include a trap site Ts. The trap site Ts may be formed by a defect occurring in the incomplete bonding.

The variable resistance layer 130 may be programmed to a low resistance state or a high resistance state by an operating voltage applied to the bit line 110 and the word line 160.

In a first write operation for programming to the low resistance state, electrons may be captured in the trap site Ts. As an amount of electrons distributed in a state in which the electrons are captured in the trap site Ts increases, an electrical resistance of the variable resistance layer 130 may decrease. As a result, the variable resistance layer 130 may have a plurality of resistance states distinguished from each other according to the amount of electrons captured in the trap site Ts.

In a second write operation for programming to the high resistance state, the amount of electrons captured in the trap site Ts may decrease.

A thickness t2 of the second barrier layer 140A may be thicker than a thickness t1 of the first barrier layer 120A. Accordingly, the efficiency of tunneling of electrons through the first barrier layer 120A can be improved, and a leakage current through the second barrier layer 140A can be reduced.

A dielectric constant of the second barrier layer 140A may be greater than a dielectric constant of the first barrier layer 120k Accordingly, the efficiency of tunneling of electrons through the first barrier layer 120A can be improved, and the leakage current through the second barrier layer 140A can be reduced. The second barrier layer 140A may include ferroelectrics. As described with reference to FIG. 1, a leakage current can be reduced by using a polarization phenomenon of ferroelectrics, and a data retention characteristic of the memory cell 150 can be improved.

Figure 4:
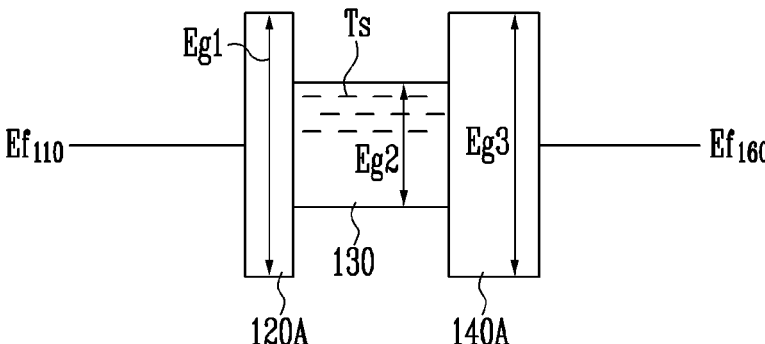
FIG. 4 illustrates an energy band diagram of a memory cell in a state in which no electric field is applied in accordance with an embodiment of the present disclosure.
Figure 5A:
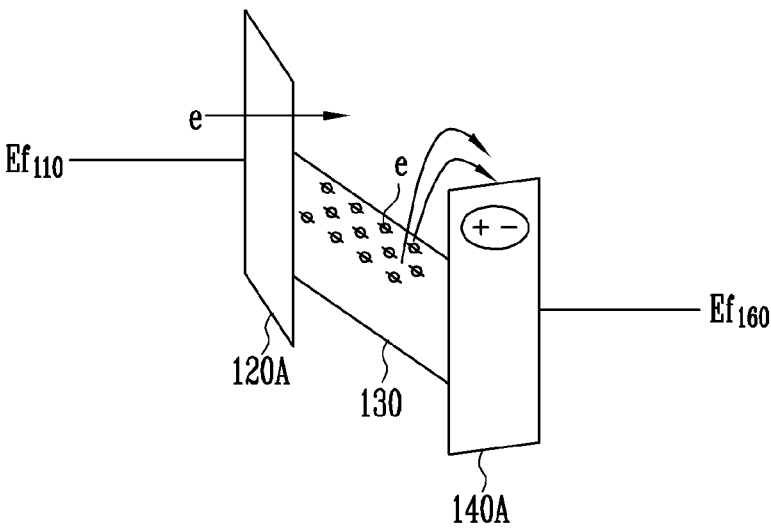
FIGS. 5A and 5B illustrate energy band diagrams, illustrating a first write operation of a semiconductor device in accordance with an embodiment of the present disclosure.
Figure 5B:
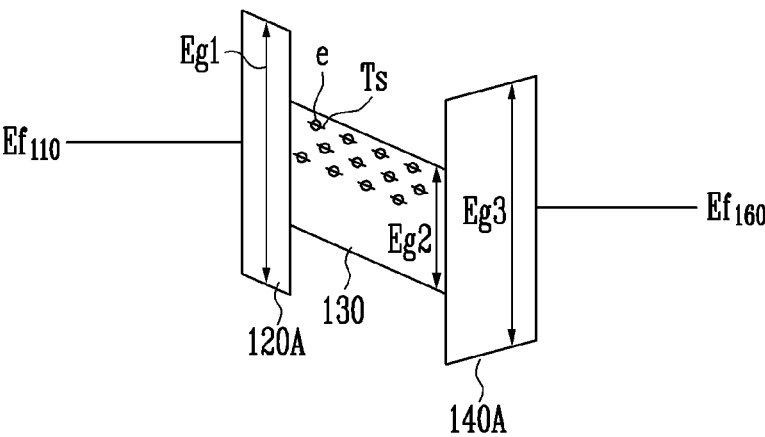
Figure 6A:
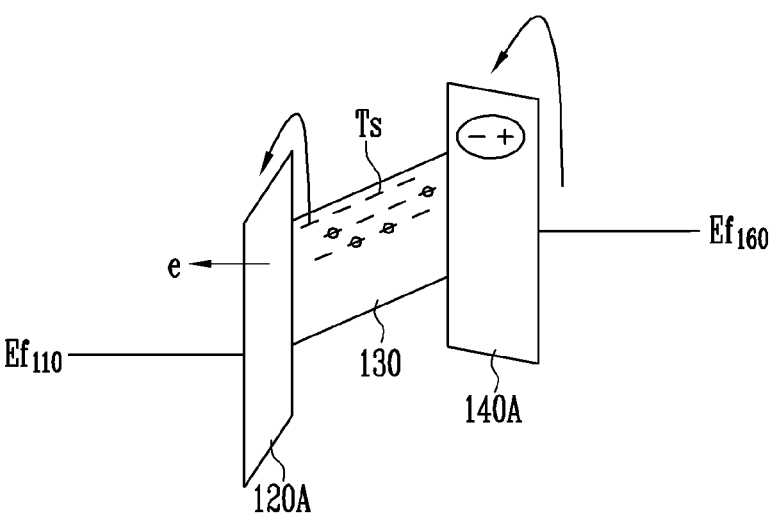
FIGS. 6A and 6B illustrate energy band diagrams, illustrating a second write operation of the semiconductor device in accordance with an embodiment of the present disclosure.
Figure 6B:
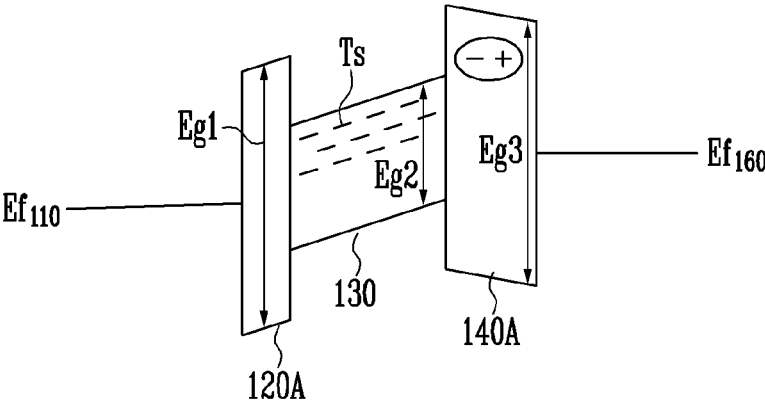

FIG. 4 illustrates an energy band diagram of a memory cell in a state in which no electric field is applied in accordance with an embodiment of the present disclosure. FIGS. 5A and 5B illustrate energy band diagrams, illustrating a first write operation of a semiconductor device in accordance with an embodiment of the present disclosure, FIGS. 6A and 6B illustrate energy band diagrams, illustrating a second write operation of the semiconductor device in accordance with an embodiment of the present disclosure. In the following diagrams, $Ef_{110}$ represents a Fermi energy level of the bit line 110 shown in FIG. 3, and $Ef_{160}$ represents a Fermi energy level of the word line 160 shown in FIG. 3. In addition, Eg1 represents an energy band gap of the first barrier layer 120A shown in FIG. 3, Egg represents an energy band gap of the variable resistance layer 130 shown in FIG. 3, and Eg3 represents an energy band gap of the second barrier layer 140A shown in FIG. 3.

Referring to FIGS. 3 and 4, a Fermi energy level $Ef_{110}$ of the bit line 110 and a Fermi energy level $Ef_{160}$ may be the substantially same in an initial state in which no electric field is applied to the memory cell. An energy band gap Eg2 of the variable resistance layer 130 may be smaller than an energy band gap Eg1 of the first barrier layer 120A, In the initial state, no electron is filled in a trap site Ts of the variable resistance layer 130.

Referring to FIGS. 3 and 5A, for the purpose of a first write operation of a low-resistance state, a positive voltage may be applied to the word line 160 in a state in which the bit line 110 is grounded. Accordingly, the word line 160 may have a relatively high potential, and the bit line 110 may have a relatively low potential.

According to application of an operating voltage for the first write operation, energy bands of the first barrier layer 120A, the variable resistance layer 130, and the second barrier layer 140A may be bent. Because the dielectric constant of the first barrier layer 120A is smaller than the dielectric constant of the second barrier layer 140A, a degree to which the energy band of the first barrier layer 120A is bent may be greater than a degree to which the energy band of the second barrier layer 140A is bent. Accordingly, it becomes easy for electrons to tunnel through the first barrier layer 120A, and thus the efficiency of tunneling of electrons can be improved. Electrons tunneling through the first barrier layer 120A may be captured in the trap site Ts of the variable resistance layer 130.

As an amount of electrons captured in the trap site Ts increases, the resistance of the variable resistance layer 130 may decrease as compared with the initial state shown in FIG. 4.

The amount of electrons captured in the trap site Ts may be in proportion to a magnitude of the operating voltage (e.g., a voltage of the word line) for the first write operation. As the magnitude of the operating voltage is increased, the amount of electrons captured in the trap site Ts may increase. As a result, the variable resistance layer 130 may be programmed to any one of the plurality of resistance states distinguished from each other.

In an embodiment, the operating voltage may be applied in a pulse form. When the operating voltage is applied, the amount of electrons captured in the trap site Ts may increase as a number of times the pulse voltage is applied increases. As a result, as the number of times the pulse voltage is applied increases, the electrical resistance of the variable resistance layer 130 may decrease.

Referring to FIGS. 3 and 5B, after the first write operation is ended, the trap site Ts of the variable resistance layer 130 may preserve the captured electrons. Accordingly, the variable resistance layer 130 may maintain a low resistance program state.

Because the second barrier layer 140A includes ferroelectrics, the efficiency of tunneling of electrons can be improved by the polarization phenomenon of the second barrier layer 140A. The polarization strength of the second barrier layer 140A can be enhanced by the electrons captured in the trap site Ts. Accordingly, a characteristic in which the electrons captured in the trap site Ts of the variable resistance layer 130 are preserved can be improved, and thus the operational reliability of the memory cell 150 can be improved.

In an embodiment, in a read operation on the memory cell 150, a cell read voltage having a positive polarity may be applied to the word line 160 in a state in which the bit line 110 is grounded. The cell read voltage may have a magnitude to a degree to which a distribution state of electrons captured in the trap site TS in the variable resistance layer 130 in the low resistance state is not changed, A current flowing in the memory cell 150 is measured based on the cell read voltage, so that a resistance state of the memory cell 150 can be read. When the memory cell 150 is programmed to the low resistance state by the first write operation, a high current may flow in the memory cell 150 by means of the cell read voltage, as compared with a current in the high resistance state.

Referring to FIGS. 3 and 6A, for the purpose of a second write operation in a high resistance state, a relatively low voltage may be applied to the word line 160 as compared with the bit line 110. That is, the second write operation may be performed by applying a reverse bias to the memory cell, as compared with the first write operation. In an embodiment, a positive voltage may be applied to the word line 160 in a state in which the bit line 110 is ground. In the other embodiment, a positive voltage may be applied to the bit line 110 in a state in which the word line 160 is ground. Accordingly, the word line 160 may have a relatively low potential, and the bit line 110 may have a relatively high potential.

According to application of an operating voltage for the second write operation, the energy bands of the first barrier layer 120A, the variable resistance layer 130, and the second barrier layer 140A may be bent. Because the dielectric constant of the first barrier layer 120A is smaller than the dielectric constant of the second barrier layer 140A, a degree to which the energy band of the first barrier layer 120A is bent may be greater than a degree to which the energy band of the second barrier layer 140A is bent. Accordingly, it becomes easy for electrons to tunnel through the first barrier layer 120A, and thus the efficiency of tunneling of electrons can be improved. In the second write operation, the trap site Ts of the variable resistance layer 130 may become empty by means of the tunneling of electrons. Accordingly, the resistance of the variable resistance layer 130 can be increased as compared with the memory cell programmed by the first write operation.

An amount of electrons left or removed from the trap site Ts through the tunneling of electrons may be in proportion to an absolute value of the operating voltage for the second write operation. As the absolute value of the operating voltage increases, the amount of electrons left or removed from the trap site Ts may increase.

In an embodiment, in the second write operation, an operating voltage corresponding to an amount of electrons to be left or removed from the whole of the trap site Ts filled with electrons may be applied to the memory cell 150. In another embodiment, in the second write operation, an operating voltage corresponding to an amount of electrons to be left or removed from a portion of the trap site Ts filled with electrons may be applied to the memory cell 150.

In an embodiment, the operating voltage for the second write operation may be applied in a pulse form. When the operating voltage is applied, the resistance of the variable resistance layer 130 may increase as a number of times the pulse voltage is applied increases.

In an embodiment, the electrons may be left or removed from the whole of the trap site Ts by applying the pulse voltage a sufficiently large number of times. In another embodiment, the electrons may be left or removed from a portion of the trap site Ts by controlling the number of times the pulse voltage is applied.

Referring to FIGS. 3 and 6B, after the second write operation is ended, the trap site Ts of the variable resistance layer 130 may maintain a de-trap state. Accordingly, the variable resistance layer 130 may maintain a high resistance program state.

As described with reference to FIG. 5B, in the read operation on the memory cell 150, the cell read voltage having the positive polarity may be applied to the word line 160 in the state in which the bit line 110 is grounded. When the memory cell 150 is programmed to the high resistance state, a low current may flow in the memory cell by means of the cell read voltage, as compared with the current in the low resistance state, or the state of the memory cell 150 may read as an off-state.

Figure 7:
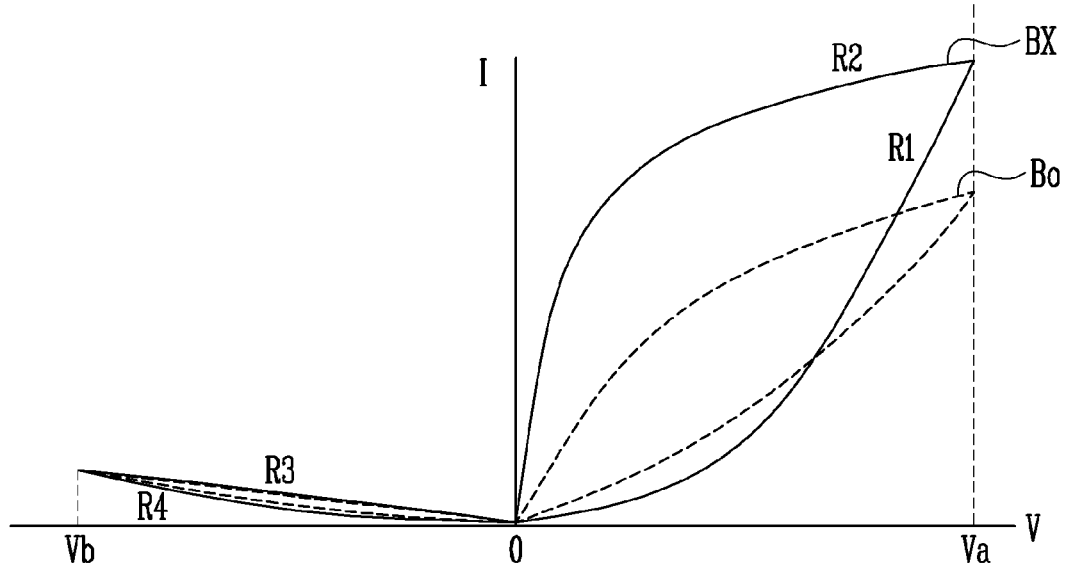
FIG. 7 is a view illustrating a voltage-current characteristic of a memory cell in accordance with an embodiment of the present disclosure.

FIG. 7 is a view illustrating a voltage-current characteristic of a memory cell in accordance with an embodiment of the present disclosure. BX shown in FIG. 7 represents a characteristic of ferroelectrics, and Bo represents a characteristic of an ordinary dielectric (e.g., a silicon dioxide ($SiO_2$) layer) instead of the ferroelectrics.

Referring to FIG. 7, as the operating voltage for the first write operation described in FIG. 5A is applied while being increased from 0V, a current output from the memory cell in reading may increase along a first route R1, The output current may correspond to a change in electrical resistance of the variable resistance layer according to the program voltage.

In an embodiment, when the second barrier layer 140A shown in FIG. 3 is used, the current output from the memory cell may increase due to an effect caused by a polarization state.

In addition, when the operating voltage for the first write operation is decreased to 0V after a first voltage Va is applied as the operating voltage, a current output while passing through the variable resistance layer may decrease along a second route R2.

Meanwhile, as the magnitude of a negative operating voltage for the second write operation described in FIG. 6A is applied while being increased from 0V, the current output while passing through the variable resistance layer may increase along a third route R3. The output current may correspond to the change in electrical resistance of the memory cell. A magnitude and an increment of the current increasing along the third route R3 may be smaller than a magnitude and an increment of the current increasing along the first route R1.

In addition, when the magnitude of the negative operating voltage is again decreased to 0V after a second voltage Vb is applied as the operating voltage for the second write operation, the current output from the memory cell may decrease along a fourth route R4. The memory cell may store an electrical resistance state increased by the application of the second voltage Vb.

A current output from the memory cell programmed to the high resistance state according to the second write operation may be smaller than a current output from the memory cell programmed to the low resistance state according to the first write operation. The memory cell in the second write operation represents a self-rectifying characteristic.

In accordance with the present disclosure, ferroelectrics are disposed between a variable resistance layer and a word line. Thus, an operation current of a memory cell can be decreased by using a polarization phenomenon of ferroelectrics, and a data retention characteristic of the memory cell can be improved. Accordingly, the operational reliability of the semiconductor device including the variable resistance layer can be improved.

While the present disclosure has been illustrated and described with reference to certain embodiments thereof, it will be understood by those skilled in the art that various changes in form and detail may be made therein without departing from the spirit and scope of the present disclosure as defined by the appended claims and their equivalents, Therefore, the scope of the present disclosure should not be limited to the above-described embodiments but should be determined by not only the appended claims but also the equivalents thereof.

In the above-described embodiments, all steps may be selectively performed or some of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
   a bit line;
   a first barrier layer disposed on the bit line;
   a variable resistance layer disposed on the first barrier layer;
   a second barrier layer disposed on the variable resistance layer; and
   a word line disposed on the second barrier layer, being in contact with the second barrier layer, and spaced apart from the variable resistance layer,
   wherein the second barrier layer is disposed between the variable resistance layer and the word line, and
   wherein a dielectric constant of the second barrier layer is greater than a dielectric constant of the first barrier layer.

2. The semiconductor device of claim 1, wherein a thickness of the second barrier layer is thicker than a thickness of the first barrier layer.

3. The semiconductor device of claim 1, wherein the variable resistance layer comprises a trap site in which electrons introduced from the bit line are captured, and
   wherein the variable resistance layer has an electrical resistance changed according to an amount of electrons captured in the trap site.

4. The semiconductor device of claim 1, wherein the second barrier layer includes ferroelectrics.

5. The semiconductor device of claim 1, wherein the variable resistance layer includes a metal oxide, and
   wherein the metal oxide includes at least one of hafnium oxide, zirconium oxide, tantalum oxide, titanium oxide, and tungsten oxide.

6. The semiconductor device of claim 1, wherein the first barrier layer, the variable resistance layer, and the second barrier layer form a pillar structure between the bit line and the word line.

7. The semiconductor device of claim 1, wherein the bit line and the word line extend in different directions.

8. A semiconductor device comprising:
   a bit line extending in a first direction;
   a word line extending in a second direction perpendicular to the first direction; and a memory cell having a pillar structure, which is disposed in a region in which the bit line and the word line overlap with each other, wherein the memory cell includes a first barrier layer adjacent to the bit line, a second barrier layer adjacent to the word line, and a variable resistance layer between the first barrier layer and the second barrier layer, wherein the second barrier layer is disposed between the variable resistance layer and the word line, wherein a dielectric constant of the second barrier layer is greater than a dielectric constant of the first barrier layer, and wherein a thickness of the second barrier layer is greater than a thickness of the first barrier layer.

9. The semiconductor device of claim 8, wherein the variable resistance layer comprises a trap site in which electrons introduced from the bit line are captured, and wherein the variable resistance layer has an electrical resistance changed according to an amount of electrons captured in the trap site.

10. The semiconductor device of claim 8, wherein the variable resistance layer includes a metal oxide, and wherein the metal oxide includes at least one of hafnium oxide, zirconium oxide, tantalum oxide, titanium oxide, and tungsten oxide.

11. A semiconductor device comprising:

a first bit line extending in a first direction;

a first memory cell overlapping with a portion of a top surface of the first bit line;

a word line extending in a second direction perpendicular to the first direction on the first memory cell;

a second memory cell overlapping with a portion of a top surface of the word line; and a second bit line extending in the first direction on the second memory cell, wherein the first memory cell includes a first barrier layer, a second barrier layer, and a first variable resistance layer disposed between the first and the second barrier layers, wherein the second memory cell includes a third barrier layer, a fourth barrier layer, and a second variable resistance layer disposed between the third and the fourth barrier layers, wherein the second barrier layer and the third barrier layer include ferroelectrics, and wherein the first variable resistance layer and the second variable resistance layer include a transition metal oxide.

12. The semiconductor device of claim 11, wherein the first barrier layer is disposed between the first bit line and the first variable resistance layer, wherein the second barrier layer is disposed between the first variable resistance layer and the word line, wherein the third barrier layer is disposed between the word line and the second variable resistance layer, and wherein the fourth barrier layer is disposed between the second variable resistance layer and the second bit line.

13. The semiconductor device of claim 11, wherein the first memory cell and the second memory cell have a pillar structure.

14. The semiconductor device of claim 11, wherein a thickness of the second barrier layer is greater than a thickness of the first barrier layer, and a thickness of the third barrier layer is greater than a thickness of the fourth barrier layer.

15. The semiconductor device of claim 11, wherein a dielectric constant of the second barrier layer is greater than a dielectric constant of the first barrier layer, and a dielectric constant of the third barrier layer is greater than a dielectric constant of the fourth barrier layer.

16. The semiconductor device of claim 11, wherein the first variable resistance layer and the second variable resistance layer include a metal oxide which does not satisfy a stoichiometric ratio.

* * * * *